(12) United States Patent
Whitt et al.

(10) Patent No.: US 8,763,410 B2
(45) Date of Patent: *Jul. 1, 2014

(54) METHOD AND APPARATUS FOR THE DISSOLUTION AND FILTRATION OF A HYPERPOLARIZED AGENT WITH A NEUTRAL DISSOLUTION MEDIA

(75) Inventors: David Brandon Whitt, Long Beach, CA (US); Andrew Michael Leach, Clifton Park, NY (US); Peter Miller, New London, CT (US); Eric Telfeyan, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 1144 days.

This patent is subject to a terminal disclaimer.

(21) Appl. No.: 12/106,570

(22) Filed: Apr. 21, 2008

(65) Prior Publication Data

US 2009/0263325 A1 Oct. 22, 2009

(51) Int. Cl.
*F25B 19/00* (2006.01)
*A61B 5/055* (2006.01)

(52) U.S. Cl.
USPC ............ 62/51.1; 62/45.1; 324/307; 324/309; 424/9.3

(58) Field of Classification Search
USPC .................................. 62/45.1–54.3; 424/9.3
See application file for complete search history.

(56) References Cited

U.S. PATENT DOCUMENTS

| | | | | |
|---|---|---|---|---|
| 5,809,801 A | * | 9/1998 | Cates et al. ..................... | 62/637 |
| 6,033,645 A | * | 3/2000 | Unger et al. .................... | 424/9.5 |
| 6,199,385 B1 | * | 3/2001 | Driehuys et al. ................ | 62/51.1 |
| 6,466,814 B1 | | 10/2002 | Ardenkjaer-Larsen et al. | |
| 6,523,356 B2 | * | 2/2003 | Hasson et al. .................. | 62/49.1 |
| 7,102,354 B2 | | 9/2006 | Ardenkjaer-Larsen et al. | |
| 7,372,274 B2 | | 5/2008 | Ardenkjaer-Larsen et al. | |
| 2007/0038076 A1 | | 2/2007 | Osada et al. | |
| 2008/0240998 A1 | * | 10/2008 | Urbahn et al. .................. | 422/99 |

FOREIGN PATENT DOCUMENTS

JP 2004512882 A 4/2004
(Continued)

OTHER PUBLICATIONS

Wilson, A Vacuum-Tight Sliding Seal, Feb. 1941, Review of Scientific Instruments, vol. 12, Issue 2, pp. 91-93.*
Leach et al., "Methods and Devices for Dynamic Filtration of Pharmaceutical Products", U.S. Appl. No. 11/766,881, filed Jun. 22, 2007.
(Continued)

*Primary Examiner* — In Suk Bullock
*Assistant Examiner* — Robert Eom
(74) *Attorney, Agent, or Firm* — Joseph J. Christian

(57) ABSTRACT

Methods and apparatuses that facilitate dissolving a hyperpolarized agent within a polarizer and transporting it to a receiver is provided. The methods include delivering water to a hyperpolarized agent contained within a polarizer, forming a hyperpolarized aqueous solution, transporting the aqueous solution through a fluid path system out of the polarizer, filtering the aqueous solution through a partical size exclusion filter to a receiver, and modifying the pH of the filtered hyperpolarized aquous solution with a dissolution medium contained in the receiver. Also disclosed herein are apparatuses for dissolving a hyperpolarized agent comprising a vial for containing a hyperpolarized imaging agent therein, a dissolution fluid path, a delivery fluid path, a particle size exclusion filter, and a receiver connected to the particle size exclusion filter and positioned to receive the filtered aqueous solution of the hyperpolarized imaging agent.

11 Claims, 4 Drawing Sheets

(56) References Cited

FOREIGN PATENT DOCUMENTS

| | | |
|---|---|---|
| JP | 3682044 B2 | 8/2005 |
| JP | 2007021008 A | 2/2007 |
| JP | 2008237910 A | 10/2008 |
| WO | WO 2006011809 | 2/2006 |
| WO | 2006077361 A2 | 7/2006 |
| WO | 2008121458 A1 | 10/2008 |

OTHER PUBLICATIONS

Urbahn et al.., "Fluid Path System for Dissolution and Transport of Hyperpolarized Material", U.S. Appl. No. 11/692,642, filed Mar. 28, 2007.

Unofficial English translation of Office Action from EP dated Aug. 8, 2013.

Unofficial English translation of Office Action from JP dated Sep. 3, 2013.

\* cited by examiner

METHOD AND APPARATUS FOR THE DISSOLUTION AND FILTRATION OF A HYPERPOLARIZED AGENT WITH A NEUTRAL DISSOLUTION MEDIA

BACKGROUND OF THE INVENTION

The invention relates generally to a method and apparatus for the dissolution and transport of a imaging agent, for use in magnetic resonance imaging (MRI) and analytical high-resolution NMR spectroscopy.

MRI is a diagnostic technique that has become particularly attractive to physicians as it is non-invasive and does not involve exposing the patient under study to X-rays associated with other medical imaging techniques. Analytical high resolution NMR spectroscopy is routinely used in the determination of molecular structure. MRI and NMR spectroscopy can, however, lack sensitivity due to the normally very low polarization of the nuclear spins of the contrast agents typically used. As such, a number of techniques exist to improve the polarization of nuclear spins while in the solid phase. These techniques are known as hyperpolarization techniques and lead to an increase in sensitivity. In hyperpolarization techniques, a sample of an imaging agent, for example $^{13}C$-pyruvate or another similar imaging agent capable of being polarized, is introduced or injected into the subject being imaged. The hyperpolarized $^{13}C$-pyruvate is obtained from dynamic nuclear polarization (DNP) of $^{13}C$-pyruvic acid using an Electron Paramagnetic Agent (EPA).

In many instances, the imaging agent undergoes this hyperpolarization in an apparatus remote from its end use. The hyperpolarization has a very short life span, and as such, the hyperpolarized material must be quickly transformed into a useable state and transferred from its production source to its place of intended end use (i.e., injection into a patient). To accomplish this, the cryogenically frozen hyperpolarized material is dissolved into a dissolution medium for injection into the patient. Thus, as a part of a dynamic nuclear polarization (DNP) system, a means for dissolving the polarized sample within the polarizer must be included.

In the current methodology, for a sample of polarized acid (e.g., pyruvic acid), it is necessary to use a dissolution medium to dissolve the sample and obtain a solution of polarized sodium salt (e.g., sodium pyruvate) suitable for in vivo injection. The dissolution medium (DM) typically is comprised of an alkaline solution including a base (e.g., sodium hydroxide) and a buffering agent (e.g., TRIS hydroxymethyl aminomethane (TRIS)) to dissolve and neutralize the sample.

In this process a defined volume of dissolution medium containing sodium hydroxide, TRIS-buffer, and EDTA (ethylenediaminetetraacetic acid) is pressurized within a plastic cylinder and heated to a defined temperature. When the dissolution process is started, the pressurized and heated solvent is released from the cylinder and guided by a fluid path into contact with the polarized sample. The dissolved sample is ejected through a filter, which chemically retains the EPA. The dissolved polarized sample passes to a receiver vessel. The receiver vessel may be empty, contain additional dissolution medium, or water for dilution or temperature regulation.

The basic DM produces a dyanmic pH profile during the dissolution so it interacts with acidic hyperpolarized imaging agent $^{13}C$-pyruvic acid ($^{13}CPA$) and EPA mixture. Problems can arise from the dynamic pH profile of the dissolution as it is a major factor in a successful dissolution. It can influence, EPA filtration, liquid-state polarization (LSP), final pH, and pyruvic acid concentration in the solution. The dynamic pH profile actually enables EPA filtration with specific water wettable resins. Also the final pH of the solution to be injected requires the correct amount of sample and DM to be flushed out of the system and can therefore be influenced by the dynamic pH profile. The profile, the basic nature of the DM, significant temperature, and other chemical burdens necessitate a robust material to prevent degradation.

With respect to EPA filtration, the system requirements have been addressed by three previous specific methods: pre-mixing the solution before filtration, using a pre-conditioned filter, or using an unconditioned filter. The pre-mixing method allows all of the components of the solution to collect in a vessel where they are mixed and neutralized after the dissolution. This in effect bypasses the need to consider the dynamic pH profile. After the solution is mixed, it is then pushed through a filter to remove the EPA and collected in a second vessel where it is checked for quality before being dispensed to the patient. This method would require two collection vessels, two sources of pressure—one at the syringe and one at the first receiver to push the solution through the EPA filter—to cause the fluid to flow and would take more time than the following methods. The total time of the dissolution is important because the hyperpolarized parenteral is only active for a short time.

Compared to the pre-mixing method, making use of either a pre-conditioned filter or an unconditioned filter eliminates the need for two collection vessels and two sources of pressure now requiring only one in each instance. It also reduces the overall time for the dissolution.

The issue with the pre-conditioned filter is that the pre-conditioning step uses a solvent to activate the filter and this activation needs to be preserved from activation in the factory to the point of final use. Care must be taken that the solvent used for activation is not injected into the patient unless it has been determined that it is an acceptable solvent for injection. An acceptable solvent for injection may not always be the best solvent for activation. One way to preserve the activation would be to freeze the filter. This would require that the filter be stored frozen and shipped frozen to its location of use and thawed out prior to use. These preservation steps may be costly and the actual temperature of the filter would have to be monitored to know whether or not the filter warmed up at any point along the way allowing for deactivation or possible biological contamination.

An unconditioned filter removes the need for the solvent activation and preservation of the activation however; the resin used in this filter is typically expensive due to its unique chemical structure and properties. Further the hyperpolarized pyruvic acid appears to more strongly interact with the water wettable resins than the neutral sodium pyruvate. For this reason it is desirable to make the transition to sodium pyruvate as quickly as possible when using the water wettable resins in the basic dissolution. The need for a rapid pH change means that significant heat must be introduced in the form of high dissolution media temperature. The alkaline dissolution process therefore requires rapid acid neutralization to minimize polarization loss due to filter resin interaction. The rapid neutralization may limit the potential for low temperature dissolutions.

Thus, a need therefore exists for a method and apparatus that can reduce the problems that can arise from using an alkaline dissolution process.

BRIEF DESCRIPTION OF THE INVENTION

The present invention overcomes the aforementioned drawbacks by providing a method and apparatus for dissolution and transport of a hyperpolarized agent in a fluid path system using water as the dissolution medium (DM) and a size exclusion filter to remove EPA from the dissolution solution. This results in a rapid and complete dissolution and transfer of a hyperpolarized material from its initial location within a polarizer system to a final location outside the polarizer system for use (e.g., injection into a patient) without loss of polarization due to pH induced interactions between the agent and resin located within the filter.

In some embodiments a method to dissolve a hyperpolarized agent within a polarizer and transport it to a receiver is provided and comprises delivering water to the hyperpolarized agent contained within a polarizer, forming a hyperpolarized aqueous solution, transporting the aqueous solution through a fluid path system out of the polarizer, filtering the aqueous solution through a partical size exclusion filter to a receiver; and modifying the pH of the filtered hyperpolarized aquous solution with a dissolution medium contained in the receiver.

In accordance with another embodiment, an apparatus is provided to aqueously dissolve a hyperpolarized agent within a polarizer and transport it to a receiver comprising a vial for containing a hyperpolarized imaging agent therein, a dissolution fluid path having an output end in fluid communication with the vial and an input end attached to a pressure vessel for holding water, a delivery fluid path having a first end hermetically attached to the vial to transport therefrom an aqueous solution of the hyperpolarized imaging agent, a particle size exclusion filter connected to the delivery fluid path, and a receiver positioned to receive the filtered aqueous solution of the hyperpolarized imaging agent and capable of holding a dissolution medium.

BRIEF DESCRIPTION OF THE DRAWINGS

These and other features, aspects, and advantages of the present invention will become better understood when the following detailed description is read with reference to the accompanying figures wherein.

DETAILED DESCRIPTION OF THE INVENTION

The following detailed description is exemplary and not intended to limit the invention of the application and uses of the invention. Furthermore, there is no intention to be limited by any theory presented in the preceding background of the invention of the following detailed description of the figures.

DEFINITIONS

As used herein the term "dynamic filtration" refers to the ability of a filtration device to remove or filter one or more components of a mixture having a time varying solubility in a medium of the mixture carrying the pharmaceutical product. As will be described in detail below, the solubility of the components may vary with changing pressure, temperature, volume, pH of the medium, for example.

As used herein the term "electron paramagnetic agent" (EPA) refers to agents, which allows for dynamic nuclear polarization by transferring spin from highly polarized electrons to nuclear spins. A commonly used EPA is tris {8-carboxyl-2,2,6,6-tetra[2-(1-methoxyethyl)]-benzo(1,2-d:4,5-d') bis(1,3)dithiole-4-yl}methyl sodium salt.

As used herein the term liquid-state polarization (LSP) refers to the polarization state resulting from the dissolution of a solid-state polarized material. Often a transfer function is used to determine dissolution efficiency (DE) whereby:

DE=Liquid-state polarization %/Solid-state polarization %.

As used herein the term "polarize" refers to the modification of the physical properties of a material for further use. Further, as used herein, the term "hyperpolarized" refers to polarization at a level over that found at room temperature and at 1 Tesla, which is further described in U.S. Pat. No. 6,466,814.

As used herein the term "hyperpolarized $^{13}$C-pyruvic acid" ($^{13}$CPA) also encompasses salts produced by conversion of $^{13}$C-pyruvic acid to $^{13}$C-pyruvate through reaction with a base and optional addition of buffer. The base may be an aqueous solution of NaOH, $Na_2CO_3$ or $NaHCO_3$ to form a sodium salt. However, the invention is not limited to sodium salts of $^{13}$CPA and may include any pharmaceutically acceptable salt of $^{13}$CPA. Isotopic enrichment of $^{13}$CPA may occur at the $C_1$ position, at the $C_2$ position, and at the $C_3$ position or combinations thereof; the $C_1$ position being preferred.

Provided herein are methods and apparatus for the aqueous dissolution and dynamic filtration of hyperpolarized imaging agents. Representative methods and apparatuses for dissolution and dynamic filtration are described in co-owned U.S. patent application Ser. No. 11/692,642 and U.S. patent application Ser. No. 11/766,881, which are incorporated herein by reference.

Figure 1:
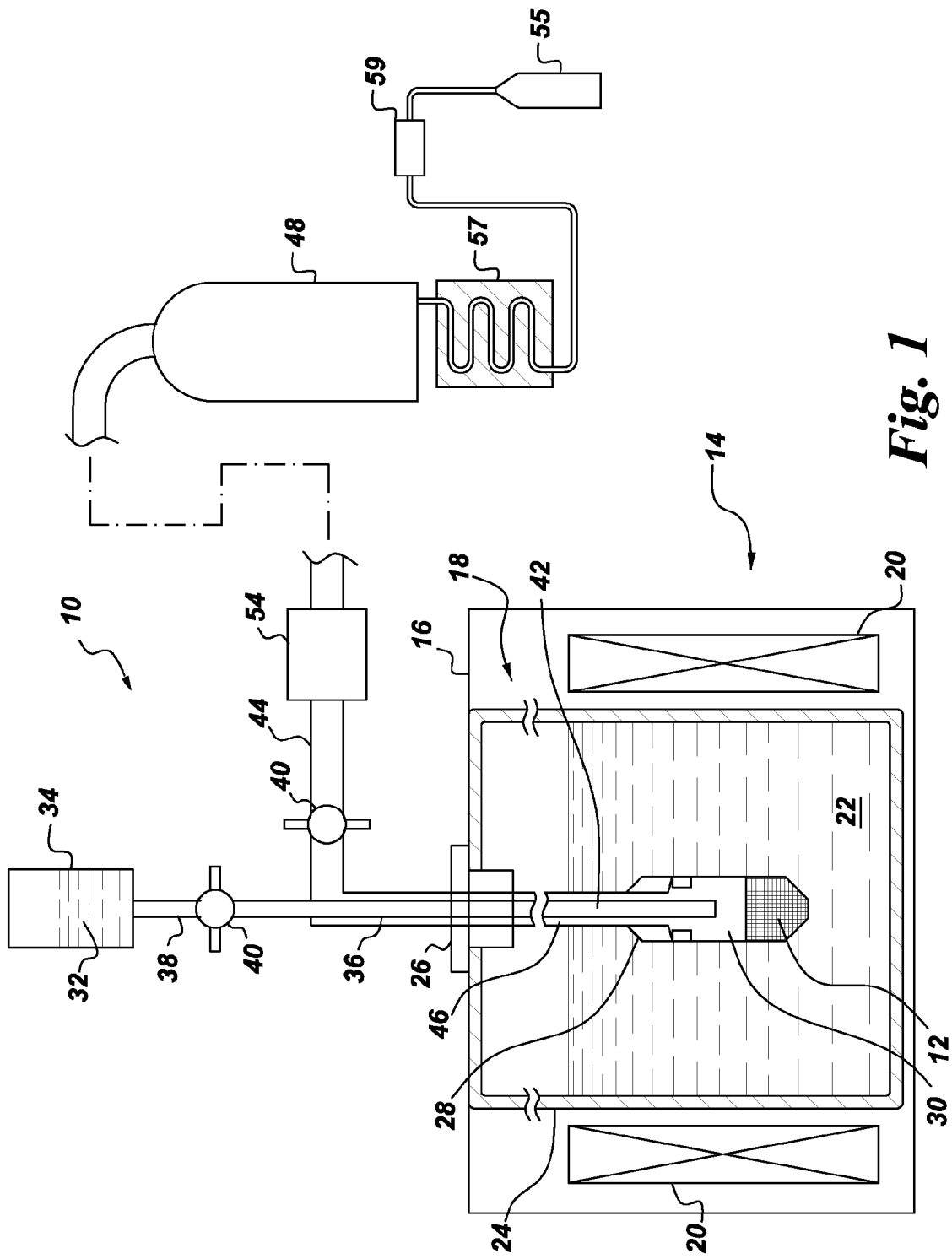
FIG. 1 is a schematic representation of the fluid path used in the DNP process.

Referring to FIG. 1, a fluid path system 10 (i.e., fluid delivery system) is shown for dissolution and filtration of an imaging agent. For example, sample 12 can be composed of $^{13}$CPA although other imaging agents are also possible. The fluid path system 10 is designed to provide a sterile barrier to the sample and resulting solution. All assemblies and parts therein are designed to prevent the user from unintentionally breaking the sterile barrier. It is further envisioned that the fluid path system 10 can be made as a disposable part (i.e., single use), but can also be re-cycled completely or in part. A single use fluid path system ensures a provision for sterility and patient safety.

Fluid path system 10 is integrated with polarizer apparatus 14 for hyperpolarizing the sample 12. The polarizer apparatus 14 is formed in part by a vacuum chamber 16 that surrounds internal components of the apparatus. Positioned within the vacuum chamber 16 is a system 18 for cryogenically cooling the sample of $^{13}$CPA and a superconducting magnet 20 that together function to hyperpolarize the sample 12. In the embodiment of FIG. 1, the cryogenic cooling system 18 includes a liquid helium bath 22 housed in container 24 to form a cryogenically cooled chamber. In one embodiment, the sample 12 is immersed in the liquid helium bath 22 and a magnetic field in the order of 3.35 Tesla is produced by superconducting magnet 20 to provide conditions for hyperpolarizing the sample 12. Microwave irradiation at an appropriate frequency is provided by a microwave radiation source (not shown) to polarize the solid sample 12 by Dynamic Nuclear Polarization (DNP).

A portion of fluid path system 10 extends down into vacuum chamber 16 of polarizer apparatus 14. To retain a vacuum within vacuum chamber 16, a sliding seal 26 is positioned about that portion of the fluid path system 10 that forms a junction or interface with vacuum chamber 16. The sliding seal 26 is configured to slide along fluid path system 10 as needed while still forming an airtight seal with vacuum chamber 16 and container 24. Thus, the vacuum conditions desired in polarizer apparatus 14 for hyperpolarizing sample 12 are maintained by way of sliding seal 26. It is also envisioned that other means of ensuring a vacuum connection to chamber 16 and container 24 with a low leak rate could be implemented, such as a bellow (not shown) attached to outer tube 44 or by way of air lock/antechamber and sliding seal (not shown) through which sample container 28 could pass through when being entered into polarizer apparatus 14 and liquid helium bath 22.

The sample 12 positioned within polarizer system 14 is contained in a sample container 28. A specified quantity or dosage of sample 12 is included in sample container 28 to be mixed with a dissolution medium solution and ultimately injected into a patient. Typically, this quantity/dosage of sample 12 may be around 2 ml in volume, although qualified health experts will determine the exact quantity. The sample container 28 is sized so that the quantity of sample 12 included therein fills only a portion of an interior volume 30 of sample container 28, with the frozen sample 12 being positioned at the bottom of sample container 28. It is also envisioned that the sample 12 could be frozen in other positions in the sample container 28, such as coating the walls of the sample container to form, for example, a hollow cylinder of sample product.

The sample container 28 is included as part of fluid path system 10 that extends down into vacuum chamber 16. In operation, the fluid path system 10 is used to dissolve the cryogenically frozen sample 12 by way of an aqueous solution and transport this dissolved sample out from vacuum chamber 16 to a desired end location, where it is injected into a patient. To provide an aqueous solution for dissolving sample 12 in sample container 28, a pressure vessel 34 is included in the fluid path system 10. In one embodiment, the pressure vessel is a syringe 34 that can be in the form of a motor powered or pneumatic syringe that produces force to inject water as the dissolution medium into fluid path system 10. In certain embodiments, an injection pressure of approximately 250 psi is used although a higher or a lower injection pressure may be used based on the fluid path design. The water preferably is purified de-ionized water in a heated state to melt and dissolve the cryogenically frozen sample 12 and can be heated to a temperature of up to approximately 130° C. or more in a pressure chamber or other suitable heating apparatus (not shown).

Attached to syringe 34 is a dissolution fluid path 36 (i.e., inner tube) that forms a fluid path between the syringe 34 and sample vial 28 containing the sample 12. An input end 38 of inner tube 36 connects to the syringe 34 in a sealed manner. Also positioned near the input end 38 of the inner tube 36, and adjacent to syringe 34, is a dissolution fluid path valve 40 located within inner tube 36. This inner tube valve 40 functions to control a fluid flow of the dissolution medium 32 out from syringe 34 and into the inner tube 36 and allows for a measured amount of water to be injected into the fluid path system 10 for dissolving sample 12 and controlling pH of the resulting hyperpolarized solution. In a neutral dissolution process, the pH is determined by the dissolution media and the amount of acid that is dissolved; a potential advantage as compared to a basic dissolution process since the amount of base can be precisely controlled and known by placing it in the receiver instead of requiring it to travel through the fluid path. An output end 42 of the inner tube 36 extends down into the interior volume 30 of sample container 28 and is thus in fluid communication therewith. The inner tube 36 is preferably composed of a material having a low thermal conductivity so as to maintain a temperature of the water 32 and minimize the loss of thermal energy therefrom as it passes through inner tube 36 and down into sample container 28. In operation, inner tube 36 delivers the water 32 in a heated state from syringe 34 down into sample container 28. In the interior volume 30 of sample container 28, the heated water 32 comes into contact with frozen sample 12. The water 32 dissolves the entirety of the sample 12 to form a mixture that forms a hyperpolarized solution.

A delivery fluid path 44 (i.e., outer tube) is also included in fluid path system 10 to create a separate fluid path from inner tube 36. In one embodiment, and as shown in FIG. 1, inner tube 36 is positioned within outer tube 44, although it is also envisioned that other arrangements could be implemented, such as a side-by-side configuration between the tubes 36 and 44 where both are connected to sample container 28 or a design where a portion of the delivery fluid path 44 and the dissolution fluid path 36 is the same.

A first end 46 of outer tube 44 is hermetically sealed to sample container 28 to form a fluid connection therebetween that is free of leaks. As stated above, a hyperpolarized solution is formed from a solution of water 32 and the dissolved sample 12 and is contained in the interior volume 30 of sample container 28. As more water 32 is injected into inner tube 36 and down into sample container 28 to dissolve sample 12, the quantity of hyperpolarized solution increases and is forced out of sample container 28. The hyperpolarized solution thus flows up into outer tube 44 forming an outer fluid path for transport of the hyperpolarized solution.

Included within outer tube 44 is a filter cartridge 54 that removes an electron paramagnetic agent (EPA) from the hyperpolarized solution and possibly other processing agents that may have been added to hyperpolarize the sample 12. The internal geometry of the filter cartridge 54 is such that the filter operates as a particle size exclusion filter, which mechanically removes the EPA from the hyperpolarized solution to make it suitable for injection. Furthermore, the filter cartridge can function as a thermal mass capable of modifying the temperature of the hyperpolarized solution to a value more suitable for injection into the patient.

After passing through the EPA size exclusion filter cartridge 54, the hyperpolarized solution may pass directly to a receiver flask 55 or pass through outer tube 44 into holding container 48. Holding container 48 may optionally contain a buffer, neutralizing agent, chelator and any other chemical needed to mix with the imaging agent solution after a complete dissolution to make the solution an acceptable pharmaceutical product. Furthermore, the solution can be held for a short time to mix the solution and where automated quality control tests can be performed as desired.

In one embodiment, further cooling of the hyperpolarized solution can be performed in holding container 48 by reducing pressure therein and/or by diluting the solution with a quantity of water for injection (e.g., 10 ml) that is at a reduced temperature. The water can already be present in container 48 or added thereto upon the accumulation of the hyperpolarized solution. The pressure reduction and the addition of the water would provide cooling. The inclusion of heat exchanger 57 in fluid path system 10 is optional. The heat exchanger can be connected to outer tube 44 between holding container 48 and flask 55 to further cool the hyperpolarized solution (if necessary) down to a temperature threshold set at 38° C. for injection of the solution into the patient Upon exiting the holding container 48 or optional heat exchanger 57, it is envisioned that the hyperpolarized solution can pass down outer tube 44 and optionally through additional sterile filters such as 59. Filter 59 can be added to fluid path system 10 to further ensure sterilization of the hyperpolarized solution, although it is recognized that fluid path system 10 is designed as a sterile system without the inclusion of filter 59. The filter 59 can be composed of a membrane and/or resin and can take the form of filters known in the art and as used for sterile filtering of intravenous solutions and injectable drugs. After exiting filter 59, the solution then passes into flask 55. Additional dissolution medium or water for injection can be added to flask 55 (or already be present in the flask) to mix with the hyperpolarized solution as desired to create a desired temperature, concentration, and/or pH level. The temperature, concentration, and pH of the hyperpolarized solution in flask 55 can then be measured by an operator to ensure it is at or below a threshold temperature, where in one embodiment the threshold temperature is 38° C., and at a suitable pH and concentration for injection into the patient.

It is also envisioned that holding container 48 be optional as well and that fluid path system 10 be designed to provide hyperpolarized solution having a desired temperature directly to receiving vessel/flask 55, or that the functions of holding container 48 could be implemented into flask 55.

Figure 2:
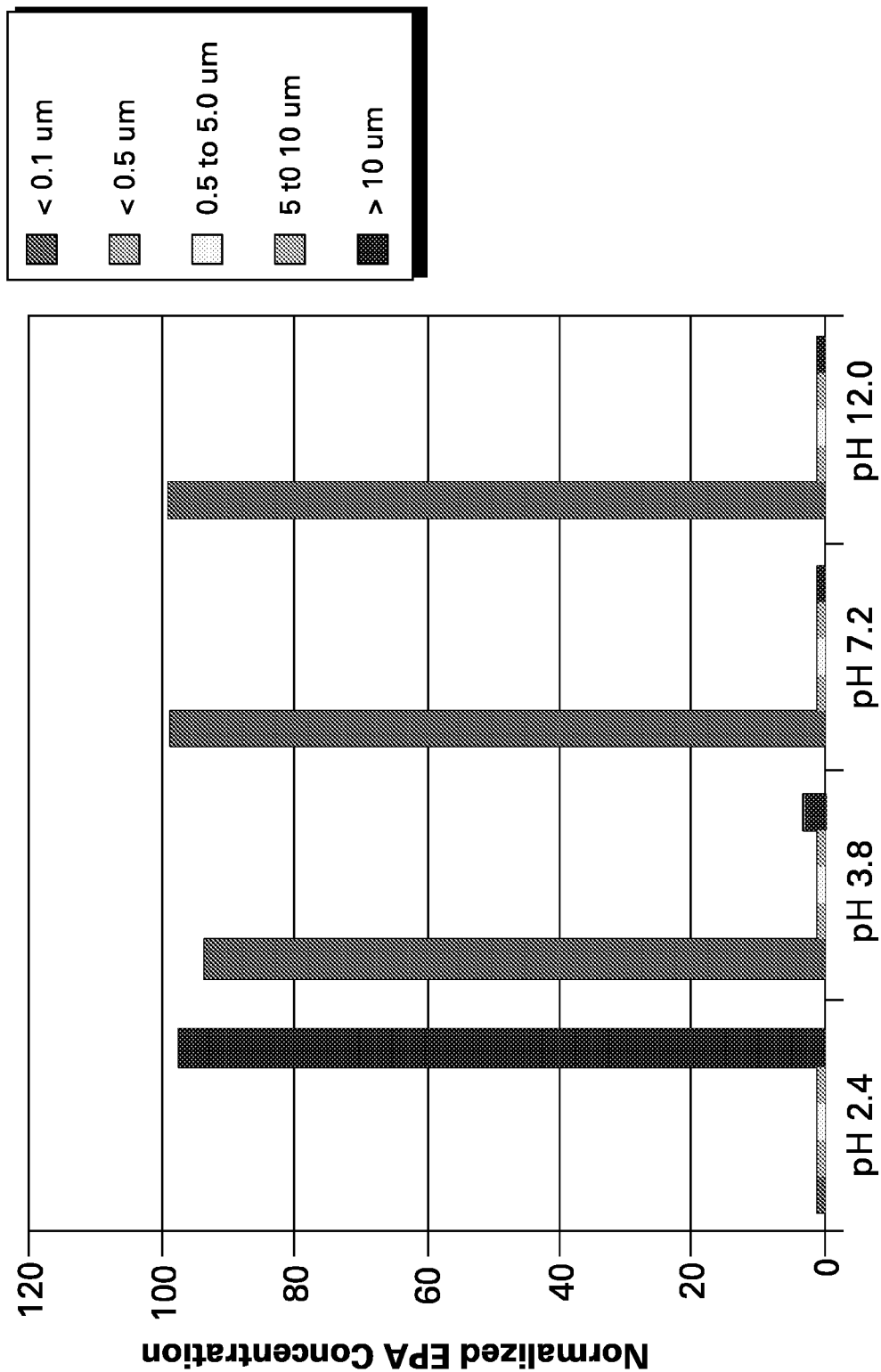
FIG. 2 is a graphical representation of particle size of EPA as a function of pH.

In an exemplary embodiment of the invention sterile deionized water is placed in the syringe of the sterile fluid path (SFP), a sample of $^{13}$CPA mixed with EPA is placed in the sample container and NaOH, TRIS, and EDTA are placed in the receiver. Size exclusion filters are placed in the filter cartridge. In this embodiment, the pH-solubility profile of the EPA is considered. EPA exhibits solubility that varies with pH. At pH less than 4, EPA is predominantly insoluble and forms particulate with diameter greater than or equal to 10 microns. Above pH 4 EPA is soluble in aqueous solutions as shown in FIG. 2

Where a 100 ml of pharmaceutical product is being formed, approximately 10 to 50 micromoles of EPA are added to the $^{13}$CPA. Assuming no filtration, this amount of EPA results in an EPA concentration of 100 to 500 micro-molar in the dissolution product. It is desirable to have EPA concentration less than or equal to permitted levels in the dissolution product, corresponding to a high filtration efficiency. For example, the filtration device may be greater than about 90 percent efficient. Accordingly, it is required to bring down the concentration of EPA to an allowable limit in the product following polarization and dissolution of the frozen $^{13}$CPA sample.

Figure 3:
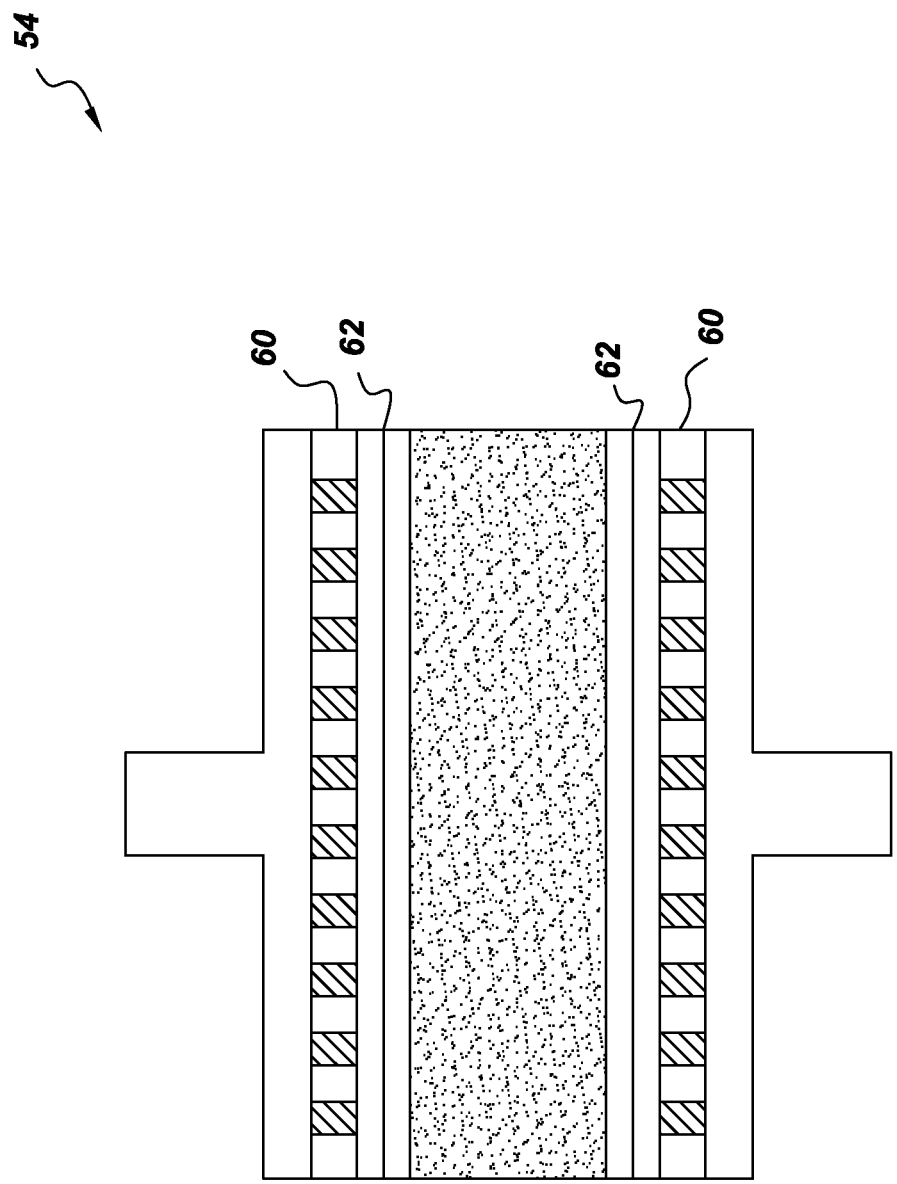
FIG. 3 is a schematic representation of a size exclusion filter cartridge.

As shown in FIG. 3, the filter cartridge 54 may use a filter plate 60 equipped with a plurality of stacked polyethylene frits 62 typically having a 20 μm pore size. Flow rate through the filter is in the range from about 3 mL/s to about 12 mL/s to allow for isolation of the DM/imaging agent solution. In one embodiment, pressure may be used to aid in wetting of the filter and allow for the EPA to be filtered from DM/imaging agent. A membrane or frit with small pore size may be used in the filter to minimize EPA penetration. The pressure in this case is the fluidic pressure of the DM/imaging agent solution being introduced into the device.

Figure 4:
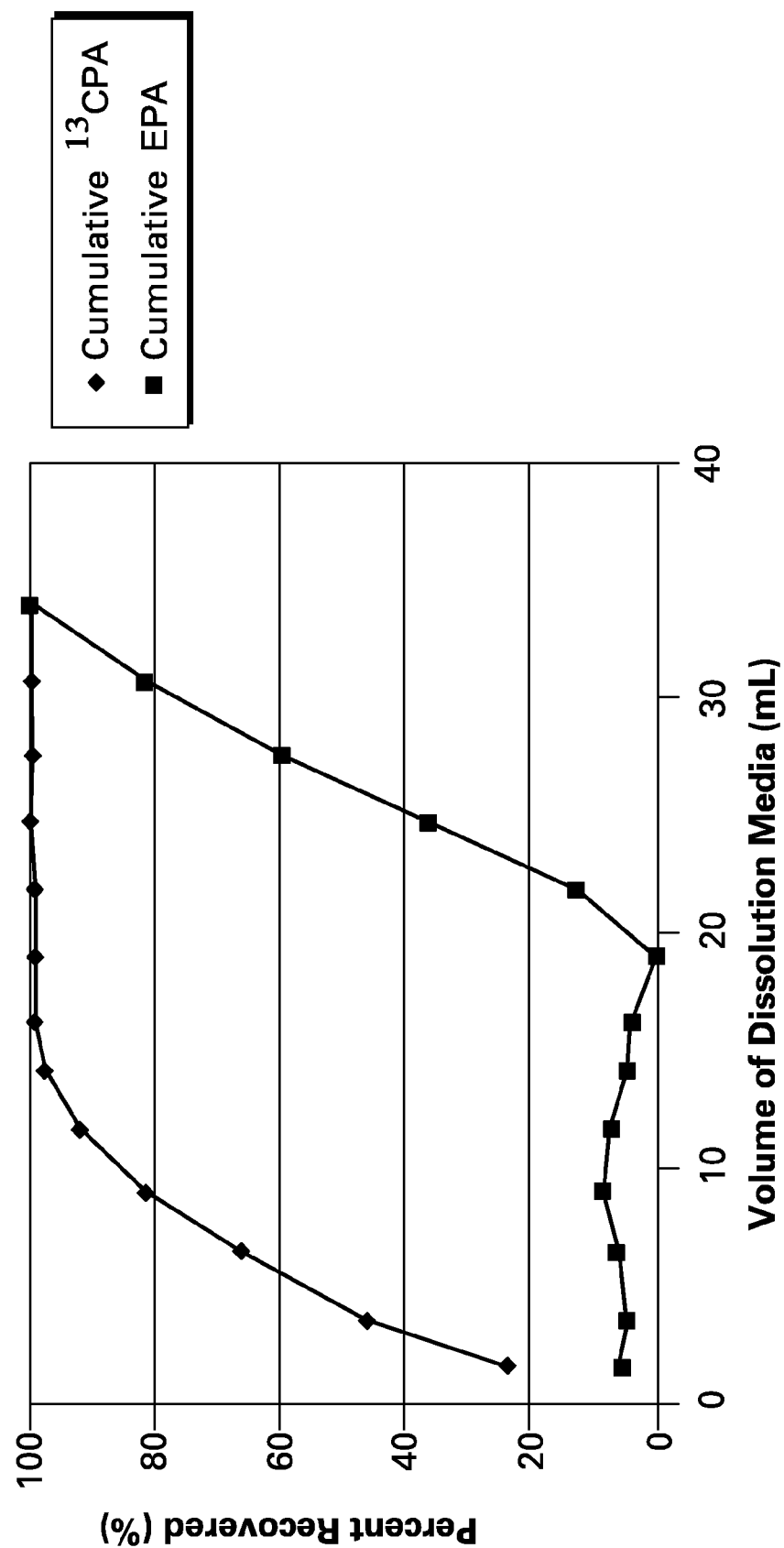
FIG. 4 is a graph illustrating the impact of dissolution media volume on $^{13}$CPA recovery and EPA filtration for a neutral dissolution.

The percentage recovery of $^{13}$CPA is based on volume of dissolution material that flows through the sample container. As the $^{13}$CPA is completely removed from the sample container the liquid arriving at the filter will increase in pH until the pH matches that of the dissolution media. In the case of a dissolution where the dissolution media is water, the pH will approach a neutral value of seven. As shown in FIG. 4, an increase in solution pH can result in solubilizing the EPA previously trapped on the filter. Therefore the total volume of the dissolution media used must be tightly controlled to ensure recovery of the $^{13}$CPA while minimizing the EPA concentration.

Referring further to FIG. 1, the acidic DM/imaging agent solution passes through the filter cartridge to a receiver to mix with NaOH a neutralizing agent, TRIS a buffer, and EDTA, which acts as an ion chelator.

In some embodiments the imaging agents will be neutral or basic. It is possible that an acidic neutralizing agent may be necessary. Similarly other buffers are possible and may be chosen for a particular situation based on the pKa, desired ionic strength and acceptability as a pharmaceutical product. Ion chelators, chosen based on activity and acceptability as a component of a pharmaceutical product may be added to remove metallic ions in solution to decrease the chance of interaction with the LSP. An acceptable pharmaceutical product is defined as a solution that has the right pH, ionic strength, percent liquid-state polarization, and concentration to be used as an effective parenteral. It may be necessary that other chemicals be added to the solution similar to excipients known in the art of pharmaceutical compounding.

The present invention has been described in terms of exemplary embodiments, and it is recognized that equivalents, alternatives, and modifications, aside from those expressly stated, are possible and within the scope of the appending claims.

EXAMPLES

Example 1

Measure of pH and EPA Residual

A fluid path syringe was filled with 22 g of 18.2 MΩcm water and 10 g of 360 mM NaOH, 200 mM TRIS and 268 μM EDTA was placed in the fluid path receiver. A mixture of $^{12}$C pyruvic acid and EPA were in the approximate ratio of 53:1 was placed in the sample container of the fluid path. The water in the syringe was heated to 130° C. and was pressurized to 250 psi. The filter body was filled with two frits used as particle size exclusion filters (Varian, part number 12131043, 1.5" diameter, average pore size 20 μm). (The valves of the PFP were opened in the normal sequence for the dissolution to occur. The resulting solution in the receiver was found to have a pH of 7.97 and an EPA concentration of 26 μM.

Example 2

Measure of Solution LSP

A fluid path syringe was filled with 28 g of 18.2 MΩcm water and 17.5 g of 360 mM NaOH, 200 mM TRIS and 268 μM EDTA was placed in the fluid path receiver. A mixture of $^{13}$CPA and EPA in the approximate ratio of 53:1 respectively was placed in the sample container of the fluid path and was polarized by a hyperpolarizer prototype. The water in the syringe was heated to 130° C. and the system was pressurized to 250 psi. The filter body was filled with five frits and they were used as particle size exclusion filters (Varian, part number 12131043, 1.5" diameter, average pore size 20 μm). The valves of the fluid path were opened in the normal sequence for the dissolutions to occur. The resulting solutions in the receiver were found to have LSP in the range of 7.6 to 10.31%.

Example 3

Comparison of EPA in Filtered and Unfiltered Solutions

A fluid path syringe was filled with 46 g of 18.2 MΩcm water and 8.75 g of 720 mM NaOH, 400 mM TRIS and 536 µM EDTA was put into the fluid path receiver. A mixture of $^{12}C$ pyruvic acid and EPA in the ratio of 53:1 respectively was placed in the sample container of the fluid path to simulate the hyperpolarized imaging agent. The water in the syringe was heated to 130° C. and the sample container was dipped into liquid nitrogen. The system was pressurized to 250 psi. A 0.45 µm Nalgene filter was connected on the back end of the filter body. The filter body contained two diffusers and two frits normally used to hold a chemical resin in place, but in this instance were used as mechanical particle size exclusion filters (Varian, part number 12131043, 1.5" diameter, average pore size 20 µm). The valves of the fluid path were opened in the normal sequence for the dissolution to occur. The resulting solution in the receiver was found to have an EPA concentration of <3 µM a 99% reduction in EPA concentration as compared to an unfiltered system.

We claim:

1. An apparatus comprising:
   a vial configured to contain a hyperpolarized agent therein;
   a dissolution fluid path having an output end in fluid communication with the vial and an input end attached to a pressure vessel configured to hold water;
   a sliding seal unit positioned between the pressure vessel and the vial configured to seal a cryogenically cooled chamber containing the vial therein from an ambient environment without contacting contents of the vial;
   a delivery fluid path having a first end and a second end, the first end hermetically attached to the vial configured to transport therefrom an aqueous solution of the hyperpolarized agent and wherein the dissolution fluid path and delivery fluid path comprise tubular structures and the dissolution fluid path is positioned internal to or parallel to the delivery fluid path and wherein the sliding seal unit is positioned about the dissolution and delivery fluid paths;
   a dynamic particle size exclusion filter having a first end and a second end, the first end connected to the second end of the delivery fluid path;
   a receiver connected to the second end of the dynamic particle size exclusion filter positioned and configured to receive the filtered aqueous solution of the hyperpolarized agent and configured to hold a dissolution medium; and
   wherein the dynamic particle size exclusion filter is positioned and configured to remove at least one of an electron paramagnetic agent (EPA) and a processing agent from the hyperpolarized solution based on when the pH value of the solution is approximately less than 4 before said hyperpolarized solution enters the receiver, further wherein the electron paramagnetic agent (EPA) comprises tris{8-carboxyl-2,2,6,6-tetra[2-(1-methoxyethyl)]-benzo(1,2-d:4,5-d')bis(1,3)dithiole-4-yl}methyl sodium salt.

2. The apparatus of claim 1 wherein the pressure vessel comprises a syringe.

3. The apparatus of claim 1 wherein the dynamic particle size exclusion filter has a pore size of about 0.1 µm to 20 µm.

4. The apparatus of claim 1 further comprising additional filters positioned between the dynamic particle size exclusion filter and the receiver configured to filter the filtered aqueous hyperpolarized solution.

5. The apparatus of claim 1 where a filter is incorporated with the dynamic particle size exclusion filter.

6. The apparatus of claim 1 further comprising a holding container positioned before the receiver.

7. The apparatus of claim 6 wherein the holding container is configured to hold reagents to mix with the aqeuous hyperpolarized agent to make the hyperpolarized agent suitable for in vivo injection.

8. The apparatus of claim 6 wherein the holding container is configured to allow quality control test on the aqueous hyperpolarized solution.

9. The apparatus of claim 1 further comprising a heat exchanger coupled to the receiver configured to control the temperature of the aqueous hyperpolarized solution.

10. The apparatus of claim 1 wherein the receiver is configured to perform one or more quality control measurements on the aqueous hyperpolarized solution.

11. The apparatus of claim 1, wherein the dynamic particle size exclusion filter further comprises a thermal mass configured to modify a temperature of the hyperpolarized solution.

* * * * *